United States Patent
Jeong et al.

(10) Patent No.: US 9,151,778 B2
(45) Date of Patent: Oct. 6, 2015

(54) SEMICONDUCTOR DEVICE TEST SOCKET (71) Applicant: Avago Technologies General IP (Singapore) Pte. Ltd., Singapore (SG)

(72) Inventors: Jin Jeong, Kyunggi (KR); William Lam, Penang (MY); Chris Chung, Seoul (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 155 days.

(21) Appl. No.: 13/900,490

(22) Filed: May 22, 2013

(65) Prior Publication Data
US 2014/0347082 A1 Nov. 27, 2014

(51) Int. Cl.
*G01R 1/00* (2006.01)
*G01R 1/04* (2006.01)
*G01R 1/067* (2006.01)
*G01R 31/28* (2006.01)

(52) U.S. Cl.
CPC ............ G01R 1/0408 (2013.01); G01R 1/0483 (2013.01); G01R 1/06772 (2013.01); *G01R 31/2886* (2013.01); *G01R 31/2889* (2013.01)

(58) Field of Classification Search
CPC ........ G01R 1/0408; G01R 1/04; G01R 1/067; G01R 1/06772; G01R 1/0458; G01R 31/2855; G01R 31/2886; G01R 3/2889; G01R 3/2866; G01R 3/2641; G01R 1/0483; H01L 23/4093
USPC ............ 324/750.27, 750.09, 754.01, 754.03, 324/754.07, 756.05, 756.02, 754.09, 324/754.18, 755.08, 755.09, 756.07, 324/762.01; 361/704; 439/330–331; 327/750.01–750.3, 754.01–754.3, 327/755.01–755.11
See application file for complete search history.

(56) References Cited

U.S. PATENT DOCUMENTS

| | | | | |
|---|---|---|---|---|
| 6,758,262 | B2* | 7/2004 | Kawabata et al. | 165/80.3 |
| 7,286,352 | B2* | 10/2007 | Curtis et al. | 361/697 |
| 8,210,875 | B2* | 7/2012 | Tan | 439/607.05 |
| 2007/0229103 | A1* | 10/2007 | Tani | 324/755 |
| 2007/0269999 | A1* | 11/2007 | Di Stefano | 439/73 |
| 2011/0090691 | A1* | 4/2011 | Markle et al. | 362/249.02 |
| 2012/0321247 | A1* | 12/2012 | Kelly et al. | 385/31 |

OTHER PUBLICATIONS

R.Sun C. Wen, R.Wu "A New Isolation Structure of Pogo Pins for Crosstalk Reduction in a Test Socket." IEEE, Components, Packaging, and Manufacturing Technology, vol. 1, issue 4, pp. 586-594.*

(Continued)

*Primary Examiner* — Melissa Koval
*Assistant Examiner* — Felicia Farrow (57) ABSTRACT A test socket for connecting a device under test (DUT) electrically to a high-frequency power source comprises a plurality of pogo pins each having an electrode, an electron-to-heat conversion plate supporting bottoms of the pogo pins, the electron-to-heat conversion plate configured to convert kinetic energy of free electrons emitted from the pogo pins to thermal energy, and a heat sink wall formed on the electron-to-heat conversion plate, the heat sink wall having a predetermined height and isolating the plurality of pogo pins from one another.

12 Claims, 15 Drawing Sheets (56) References Cited

OTHER PUBLICATIONS

Sun, et al. "A New Isolation Structure of Pogo Pins for Crosstalk Reduction in a Test Socket", IEEE Transactions on Components, Packaging and Manufacturing Technology, vol. 1, No. 4, Apr. 2011.
Everett Charles Technologies, "CSP-03G-003 High-Frequency Coaxial Probe", Sep. 2, 2010.

* cited by examiner

SEMICONDUCTOR DEVICE TEST SOCKET

BACKGROUND

A semiconductor device test socket including probes such as pogo pins or spring pins has been widely used for the testing of highly integrated semiconductor device. The test socket connects a semiconductor device electrically to a high-frequency power source.

Figure 1:
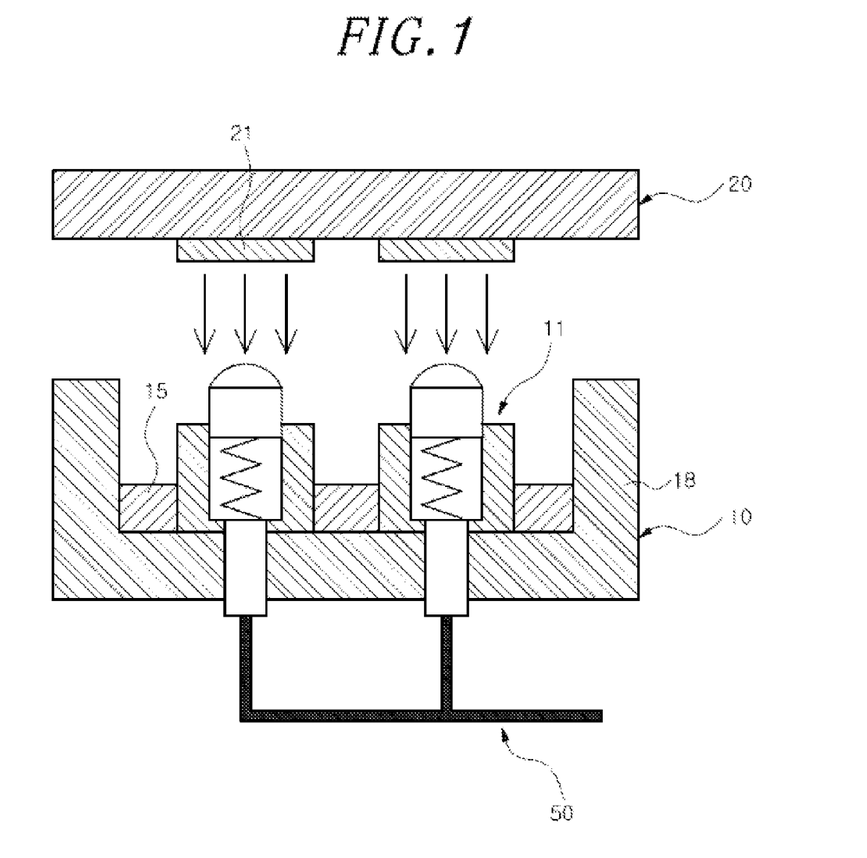
FIG. 1 illustrates a known test socket including pogo pins to test a device under test (DUT)
Figure 2:
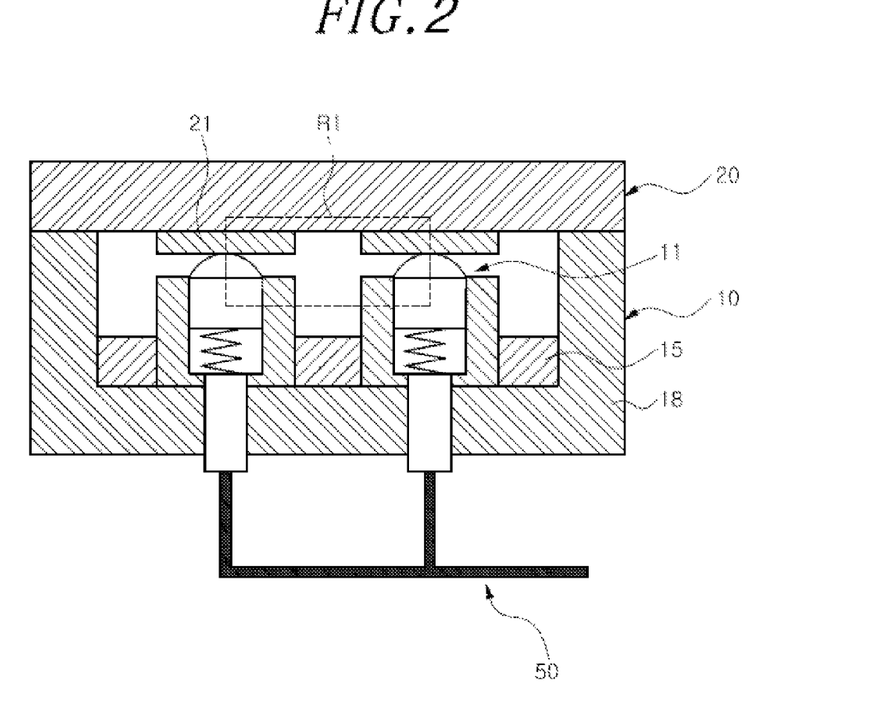
FIG. 2 shows electrical connection between contact terminals of the DUT and the pogo pins illustrated in FIG. 1.
Figure 3:
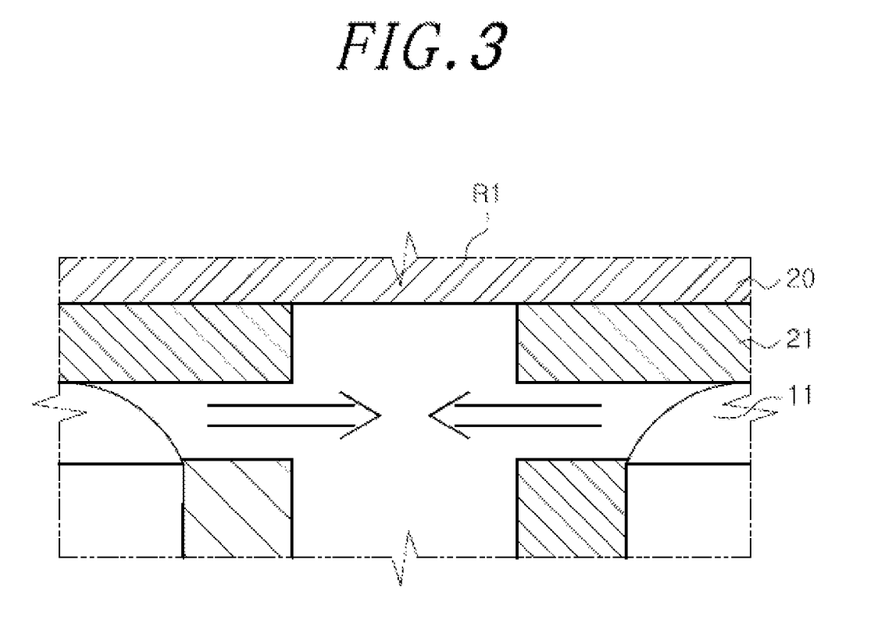
FIG. 3 is an enlarged view of an area R1 shown in FIG. 2.

FIG. 1 illustrates a known test socket including pogo pins to test a device under test (DUT), FIG. 2 shows an electrical connection between contact terminals of the DUT and the pogo pins illustrated in FIG. 1, and FIG. 3 is an enlarged view of an area R1 shown in FIG. 2.

As shown in FIG. 1, a DUT 20 has contact terminals 21 formed on one of its surfaces to receive an electrical signal. A test socket 10 includes pogo pins 11, a conductive guide unit 15 for guiding the pogo pins 11, and a test socket housing 18.

Referring to FIG. 2, when the DUT 20 is brought into an electrical connection with the pogo pins 11, a high-frequency electrical signal is transmitted from a high-frequency transmission cable 50 to the DUT 20 through the pogo pins 11 and then the DUT 20 is tested.

In general, the pogo pins 11 are separated from each other by a few micrometers. Owing to their close proximity, free electrons emitted to the air from each of the pogo pins 11 may cause signal interferences to its adjacent pogo pins 11, as illustrated in FIG. 3. The signal interferences between the pogo pins 11 may diminish the reliability of test results of the DUT 20. Accordingly, there has existed a need for a test socket which is capable of preventing a signal interference between adjacent pogo pins 11 and thereby increasing the reliability of test results of the DUT 20.

SUMMARY

It is, therefore, an object of the present teachings to provide a test socket capable of preventing a signal interference between pogo pins.

In accordance with a representative embodiment, a test socket for connecting a device under test (DUT) electrically to a high-frequency power source is disclosed. The test socket comprises a plurality of pogo pins each having an electrode, an electron-to-heat conversion plate supporting bottoms of the pogo pins, the electron-to-heat conversion plate configured to convert kinetic energy of free electrons emitted from the pogo pins to thermal energy, and a heat sink wall formed on the electron-to-heat conversion plate, the heat sink wall having a predetermined height and isolating the plurality of pogo pins from one another.

BRIEF DESCRIPTION OF THE DRAWINGS

The illustrative embodiments are best understood from the following detailed description when read with the accompanying drawing figures. It is emphasized that the various features are not necessarily drawn to scale. In fact the dimensions may be arbitrarily increased or decreased for clarity of discussion. Wherever applicable and practical, like reference numerals refer to like elements.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, the present teachings are directed to a test socket for connecting a device under test (DUT) electrically to a high-frequency power source. Hereinafter, preferred embodiments of the present invention will be described in detail below with reference to the accompanying drawings.

Figure 4:
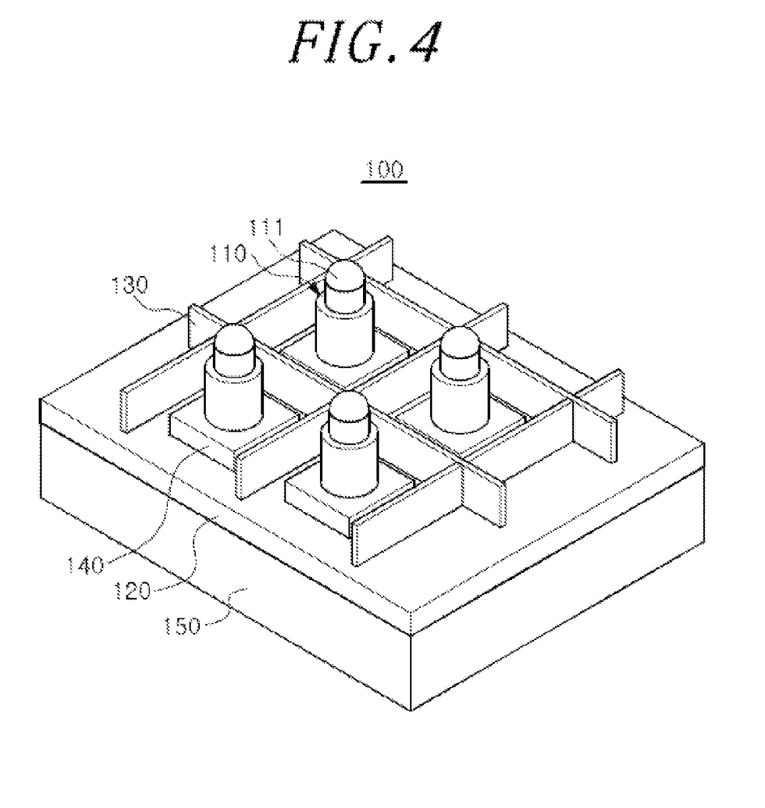
FIG. 4 illustrates a test socket in accordance with an representative embodiment.

FIG. 4 illustrates a test socket in accordance with a representative embodiment of the present invention.

Referring to FIG. 4, a test socket 100 in accordance with a representative embodiment includes a plurality of pogo pins 110, an electron-to-heat conversion plate 120 for supporting the bottoms of the pogo pins 110, a heat sink wall 130 formed to a predetermined height on the electron-to-heat conversion plate 120, for isolating the plurality of pogo pins 110 from one another, pogo pin supports 140 for supporting the bottoms of the pogo pins 110 on the electron-to-heat conversion plate 120, and a ground plate 150 for supporting the bottom surface of the electron-to-heat conversion plate 120.

Each of the pogo pins 110 includes an electrode that elastically moves down when the pogo pins 110 are brought into contact with a plurality of contact terminals of a DUT and elastically returns to an original position, when the pogo pins 110 are released from the contact with the plurality of contact terminals of the DUT.

The pogo pins 110 of the test socket 100 contact the plurality of contact terminals of the DUT and transmit a signal received from an external high-frequency power source (not shown) to the DUT.

The electrodes 111 of the pogo pins 110 may be configured in such a manner that when the pogo pins 110 contact the plurality of contact terminals, the electrodes 111 move down by means of elastic members (not shown) and when the pogo pins 110 are released from the contact with the plurality of contact terminals, the electrodes 111 return to original positions by means of the elastic members. The use of the elastic members may prevent damage to the pogo pins 110 when the pogo pins 110 are brought into contact with the contact terminals.

The electron-to-heat conversion plate 120 converts kinetic energy of approaching free electrons emitted from the pogo pins 111 to thermal energy, for electromagnetic shielding between the pogo pins 110. For kinetic-to-thermal energy conversion, the electron-to-heat conversion plate 120 may be formed of a thermistor material in which resistance increases with temperature.

Specifically, when an electrical signal is applied to the plurality of pogo pins 110, free electrons may be emitted to the air from the pogo pins 110 due to the electrical signal. The free electrons may cause signal interference to adjacent pogo pins 110. The signal interference between the pogo pins 110 may be mitigated through conversion of the kinetic energy of approaching free electrons to thermal energy in the electron-to-heat conversion plate 120.

However, since the area where each pogo pin 110 is arranged is a very small, e.g., a few square micrometers, if the number office electrons moving between the pogo pins exceeds a performance for the electron-to-heat conversion plate 120, that is, if thermal energy converted from the kinetic energy of free electrons in the electron-to-heat conversion plate 120 is not radiated to the outside, accumulated excess energy serves as thermal noise. The thermal noise affects critical signal components of the pogo pins 110, which may make it difficult to effectively mitigate signal interference between the pogo pins 110.

Accordingly, the heat sink wall 130 is formed on the heat-to-electron conversion plate 120 in order to effectively radiate thermal energy converted from the kinetic energy of free electrons by the heat-to-electron conversion plate 120 to the outside.

The heat sink wall 130 may be formed of a highly thermally conductive material. The pogo pins 110 are fabricated by processing gold (Au) plating to a copper (Cu) plate. When the heat sink wall 130 is formed of the same material as the pogo pins 110, the radiation efficiency of thermal energy may be increased. Therefore, the heat sink wall 130 may be made of gold. Of course, according to various representative embodiments, the heat sink wall 130 may be made of other highly thermally conductive material such as copper (Cu). Further, a height of the heat sink wall 130 may equal to or greater than a distance from the heat-to-electron conversion plate 120 to the contact terminals 20 and the equal to or smaller than a distance from the heat-to-electron conversion plate 120 to the DUT 20, when the contact terminals 21 of the DUT 20 are brought into contact with the pogo pins 110.

Further, an electrically conductive glue (not shown) may fill a space from the heat-to-electron conversion plate 120 to a predetermined height lower than a height of the pogo pins 110.

Figure 5:
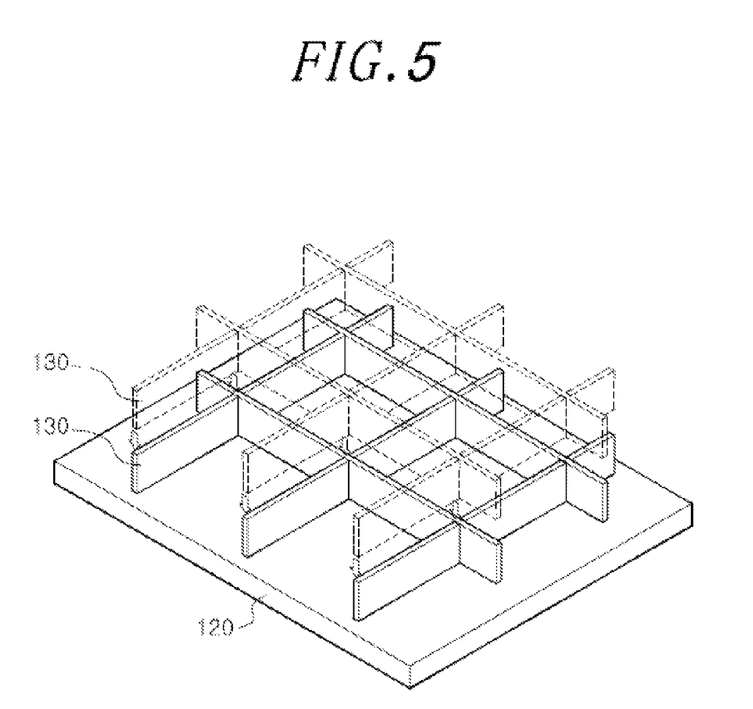
FIG. 5 illustrates a structure of a heat sink of the test socket in accordance with a representative embodiment.
Figure 6:
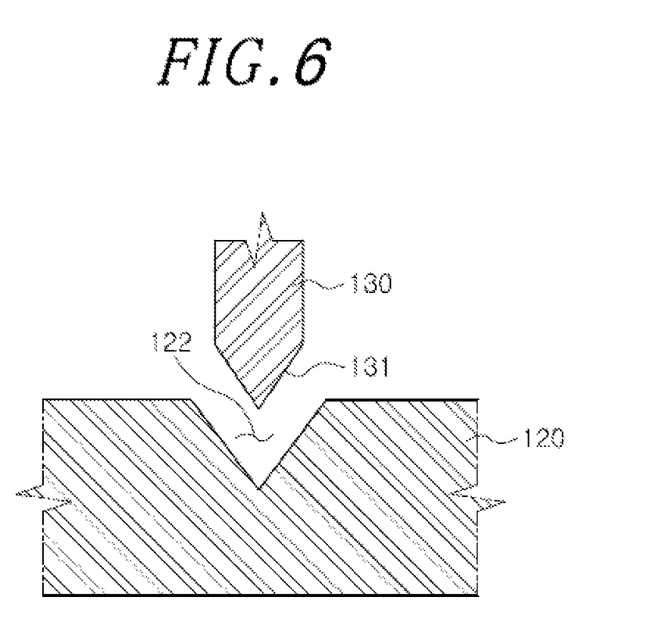
FIG. 6 illustrates engagement between an electron-to-heat conversion plate and the heat sink wall of the test socket in accordance with a representative embodiment.

FIG. 5 illustrates a structure of the heat sink wall of the test socket in accordance with a representative embodiment and FIG. 6 illustrates engagement between an electron-to-heat conversion plate and the heat sink wall of the test socket in accordance with a representative embodiment.

Because the spacing between the plurality of pogo pins 110 is very narrow, e.g., a few micrometers, it may be difficult to insert each individual plate-shaped heat sink wall 130 between pogo pins 110. Therefore, the heat sink wall 130 may be formed into a grid structure and mounted on the electron-to-heat conversion plate 120 in the test socket in accordance with a representative embodiment, as illustrated in FIG. 5.

Grooves 122 may be formed at the top surface of the electron-to-heat conversion plate 120 such that the grooves 122 are tapered from top to bottom. The grooves 122 may be shaped into wedges, for example, as illustrated in FIG. 6. Engagement portions 131 may be formed at the bottom of the heat sink wall 130 such that the engagement portions 131 are tapered from top to bottom. As the engagement portions 131 are inserted into the grooves 122, the heat sink wall 130 may be engaged with the electron-to-heat conversion plate 120.

The engagement between the heat sink wall 130 and the electron-to-heat conversion plate 120 may be completed by inserting electrically conductive glue between the heat sink wall 130 and the electron-to-heat conversion plate 120 and hardening the glue in a baker equipment for a predetermined time, thus thermally attaching the heat sink wall 130 to the electron-to-heat conversion plate 120.

In the above-described test socket in accordance with a representative embodiment, while free electrons emitted from the pogo pins 110 are being converted to heat in the electron-to-heat conversion plate 120, some free electrons may not be eliminated by the electron-to-heat conversion plate 120, for example, there may exist remaining free electrons relatively distant from the electron-to-heat conversion plate 120. To effectively eliminate the remaining free electrons, hole carriers each having holes at a predetermined density may be formed on at least a part of the surface of the heat sink wall 130.

Figure 7:
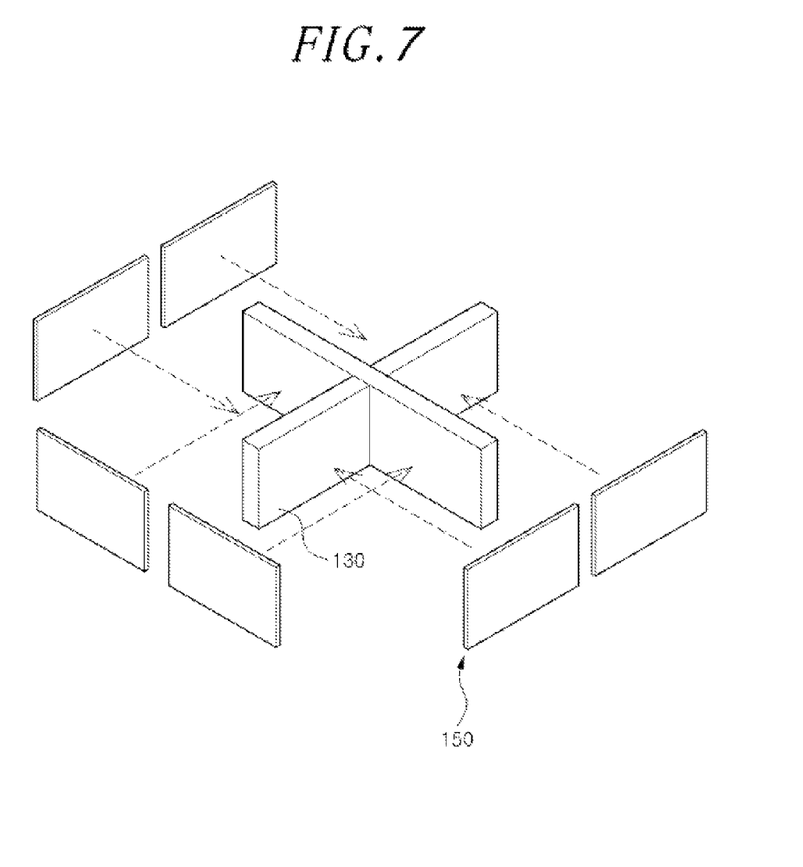
FIG. 7 illustrates installation of hole carriers to a surface of the heat sink wall of the test socket in accordance with a representative embodiment.

FIG. 7 illustrates installation hole carriers to the surface of the heat sink wall of the test socket in accordance with a representative embodiment.

Referring to FIG. 7, hole carriers 150 having highly dense holes may be attached onto the surface of the heat sink wall 130. The hole carriers 150 may be fabricated by processing a silicon (Si) semiconductor material into sheets, which allows high-integration of holes having the opposite polarity to that of free electrons. The remaining free electrons may be effectively eliminated by attaching the hole carriers 150 to at least a part of the surface of the heat sink wall 130, for example, sidewalls of the heat sink wall 130.

Figure 8A:
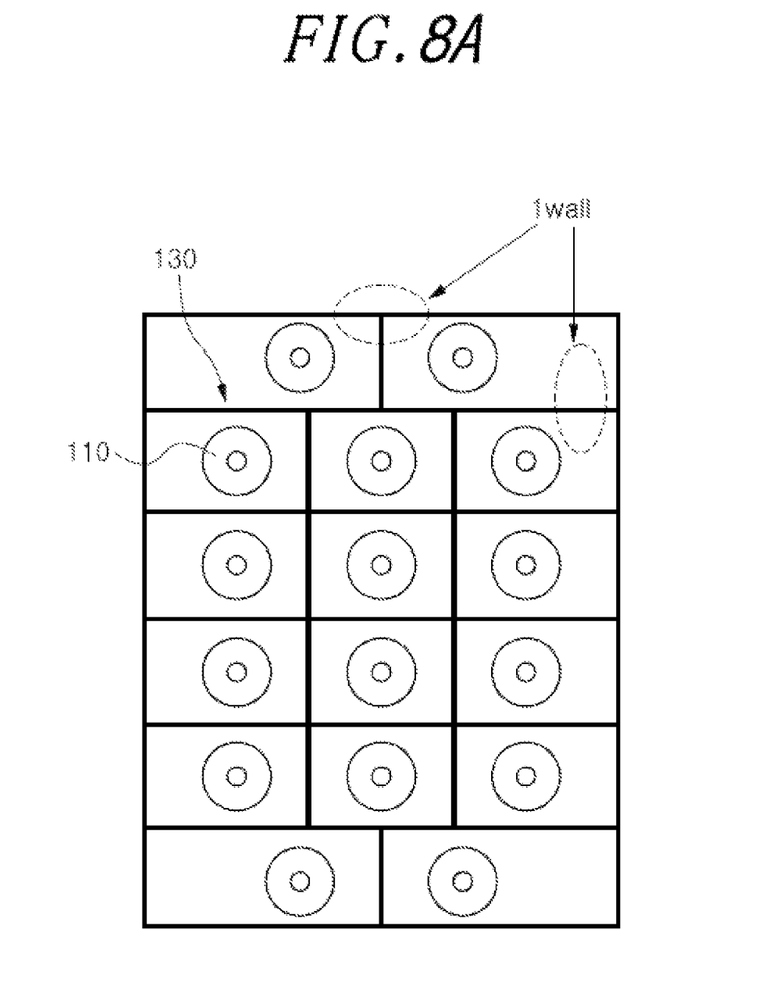
FIGS. 8A, 8B and 8C illustrate a structure of the heat sink wall of the test socket in accordance with a representative embodiment and modified examples of the structure of the heat sink wall.
Figure 8B:
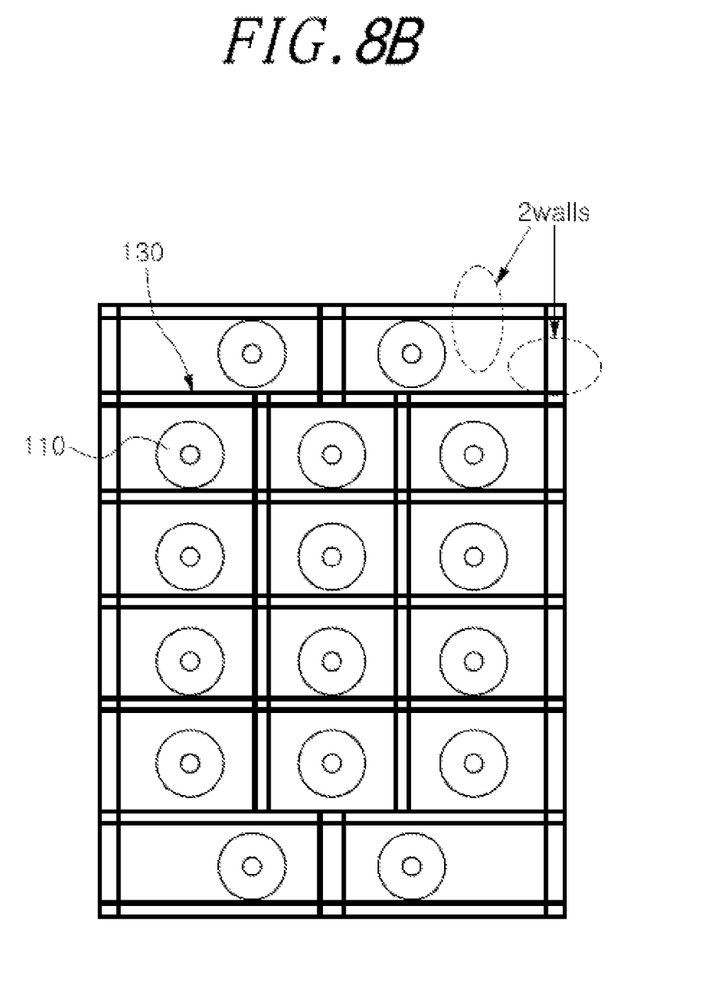
Figure 8C:
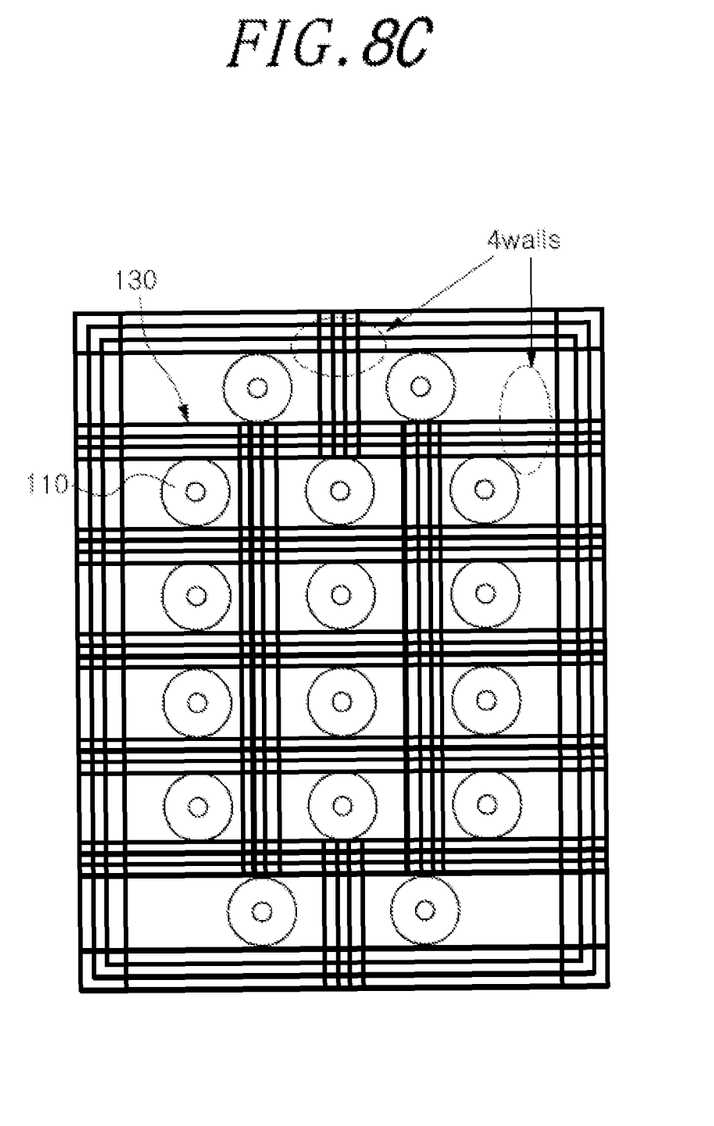

FIGS. 8A, 8B and 8C illustrate a structure of the heat sink wall and modified examples of the structure of the heat sink wall of the test socket in accordance with a representative embodiment.

FIG. 8A illustrates a single-wall heat sink wall 130 having one wall between adjacent pogo pins 110, FIG. 8B illustrates a double-wall heat sink wall 130 having double walls between adjacent pogo pins 110, and FIG. 8C illustrates a quadruple-wall heat sink wall 130 having four walls between adjacent pogo pins 110. The heat sink wall 130 has an increasing density per unit area in the order of FIGS. 8A, 8B and 8C. The structures of the heat sink wall 130 illustrated in FIGS. 8A, 8B and 8C are exemplary and thus various structures for varying the density of the heat sink wall 130 per unit area may be adopted.

Hereinafter, test sockets having the structures of the heat sink wall 130 illustrated in FIGS. 8A, 8B and 8C are denoted by reference numerals 1000S, 2000S and 4000S, respectively.

Figure 9:
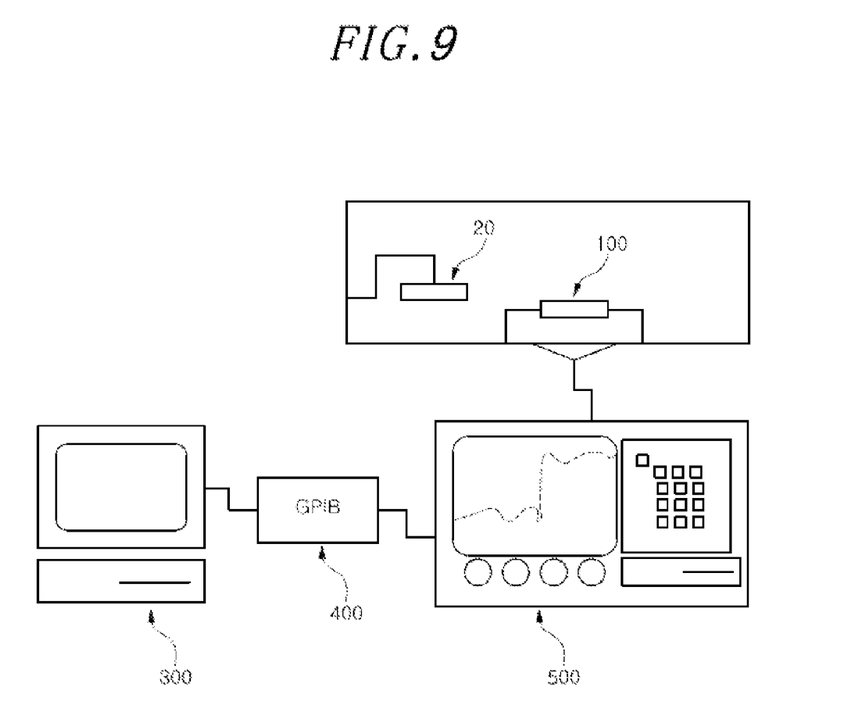
FIG. 9 illustrates a system for testing the test socket in accordance with a representative embodiment.

FIG. 9 illustrates the configuration of a system for testing the test socket in accordance with a representative embodiment.

Referring to FIG. 9, the system includes a host Personal Computer (PC) 300, a high-precision network analyzer 400, and, a General Purposed Interface Bus (GPIB) 500 for interfacing between the host PC 300 and the network analyzer 400.

The system tests the DUT 20 by connecting the DUT 20 to the test socket 100 in accordance with a representative embodiment.

Figure 10:
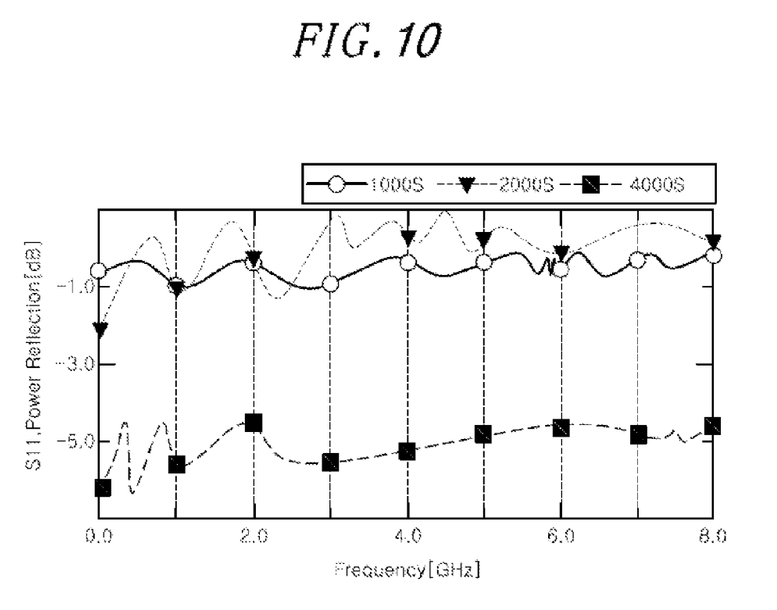
FIG. 10 is a diagram comparing exemplary curves of return losses against input frequencies of the test socket in accordance with a representative embodiment and modified examples of the test socket.
Figure 11:
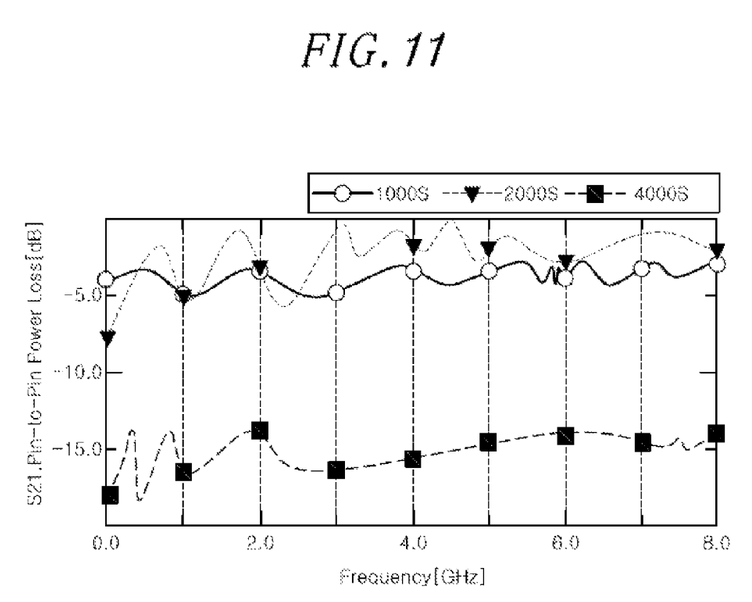
FIG. 11 is a diagram comparing exemplary curves of insertion losses against input frequencies of the test socket in accordance with a representative embodiment and the modified examples of the test socket.

FIG. 10 is a diagram comparing exemplary curves of return losses, i.e., power reflected from and returning to the same pogo pin, against input frequencies of the test socket in accordance with a representative embodiment and modified examples of the test socket and FIG. 11 is a diagram comparing exemplary curves of insertion losses, i.e., power losses from one pogo pin to its nearest pogo pin in the test socket, against input frequencies in accordance with a representative embodiment and the modified examples of the test socket.

It is noted from FIG. 10 that power reflected from a pogo pin and then returning to the pogo pin is low in frequency represented on an X axis in the three types of test sockets 1000S, 2000S and 4000S (i.e. the test sockets having the structures of the heat sink wall 130 illustrated in FIGS. 8A, 8B and 8C). Therefore, it may be concluded that the test sockets 1000S, 2000S and 4000S have performance to decrease power reflected from and returning to the same pogo pin.

Particularly, the test socket 4000S having the quadruple-wall heat sink wall 130 outperforms the other test sockets 1000S and 2000S because it is lowest in power reflected from and returning to the same pogo pin.

Referring to FIG. 11, the test sockets 1000S, 2000S and 4000S commonly have great loss of power transferred from one pogo pin to its nearest pogo pin in frequency represented on the X axis. This means that signal interference between pogo pins is prevented significantly.

Figure 12:
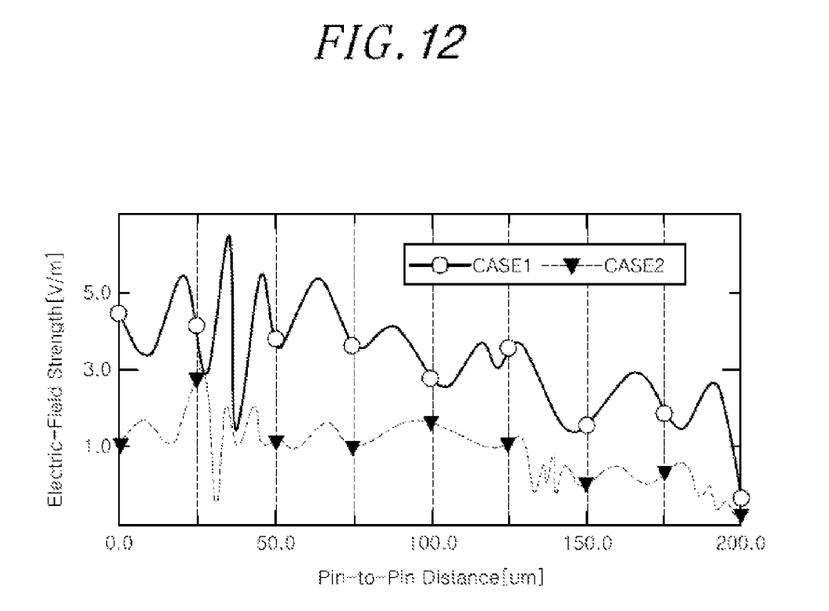
FIG. 12 is a diagram comparing exemplary curves of electric-field strengths against pin-to-pin distances of the test socket in accordance with a representative embodiment and the conventional test socket.
Figure 13:
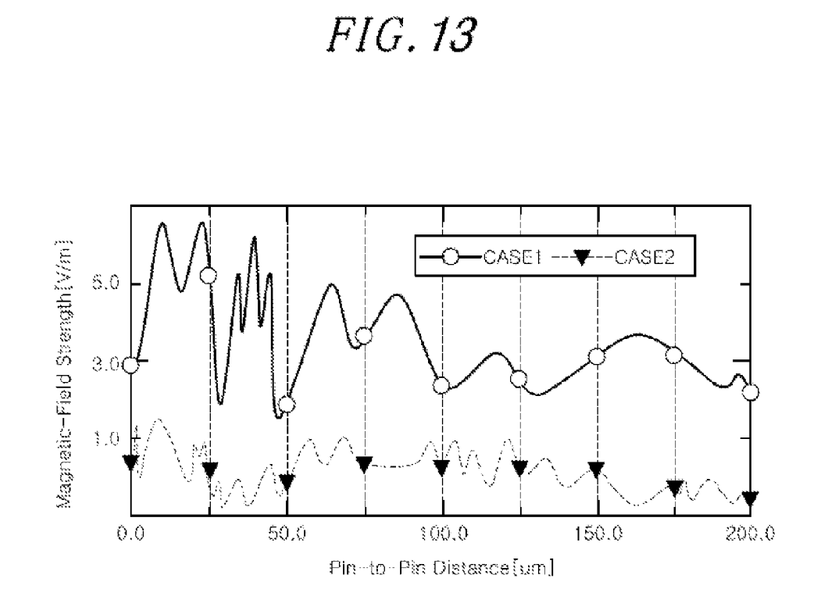
FIG. 13 is a diagram comparing exemplary curves of magnetic-field strengths against pin-to-pin distances of the test socket in accordance with a representative embodiment and the known test socket.

FIG. 12 is a diagram comparing exemplary curves of electric-field strengths against pin-to-pin distances of the test socket in accordance with a representative embodiment and the known test socket and FIG. 13 is a diagram comparing exemplary curves of magnetic-field strengths against pin-to-pin distances of the test socket in accordance with a representative embodiment and the known test socket. In FIGS. 12 and 13, a known test socket (CASE1) is compared with the test socket 100 (CASE2) in accordance with a representative embodiment.

Referring to FIGS. 12 and 13, it is revealed that the test socket in accordance with a representative embodiment has far lower electric-field strengths and magnetic-field strengths with respect to pogo-to-pogo pin distances than the known test socket. That is, the structure of the test socket in accordance with a representative embodiment significantly prevents signal interference between adjacent pogo pins. Therefore, test reliability can be increased by testing a DUT using the test socket in accordance with a representative embodiment.

As is apparent from the above description, the structure of the test socket in accordance with a representative embodiment efficiently prevents signal interference between pogo pins, thereby increasing the reliability of a test result. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A test socket thr connecting a device under test (DUT) electrically to a high-frequency power source, comprising:
   a plurality of pogo pins each having an electrode;
   an electron-to-heat conversion plate supporting bottoms of the pogo pins, the electron-to-heat conversion plate configured to convert kinetic energy of free electrons emitted from the pogo pins to thermal energy; and
   a heat sink wall formed on the electron-to-heat conversion plate, the heat sink wall having a predetermined height and isolating the plurality of pogo pins from one another.

2. The test socket of claim 1, further comprising a hole carrier having holes at a predetermined density, the hole carrier being attached to a surface of the heat sink, wall.

3. The test socket of claim 2, wherein the hole carrier is made of a silicon sheet.

4. The test socket of claim 1, wherein the heat sink wall is made of gold (Au).

5. The test socket of claim 1, wherein the electron-to-heat conversion plate is made of a thermistor material.

6. The test socket of claim 1, wherein the heat sink wall has a grid structure and the plurality of pogo pins are arranged inside the grid structure.

7. The test socket of claim 1, wherein a groove tapered from top to bottom is formed at a top surface of the electron-to-heat conversion plate and an engagement portion tapered from top to bottom is formed at a bottom of the heat sink wall, and
   wherein the heat sink wall is engaged with the electron-to-heat conversion plate by inserting the engagement portion into the groove.

8. The test socket of claim 1, further comprising a ground plate supporting a bottom of the electron-to-heat conversion plate.

9. The test socket of claim 1, wherein each electrode is configured to elastically move.

10. The test socket of claim 9, wherein each of the electrodes is configured to move in one direction when the plurality of pogo pin is brought into contact with a plurality of contact terminals of a DUT, and in an opposite direction when the plurality of pogo pins is released from the contact with the plurality of contact terminals of the DUT.

11. The test socket of claim 9, wherein each of the electrodes is configured to elastically move in a first direction and in a second direction, which is opposite to the first direction.

12. The test socket as claimed in claim 1, wherein an electrically conductive adhesive is disposed over the heat-to-electron conversion plate to a predetermined height that is lower than a height of the pogo pins.

* * * * *